(12) United States Patent
Kainuma et al.

(10) Patent No.: US 7,424,966 B2
(45) Date of Patent: Sep. 16, 2008

(54) METHOD OF ULTRASONIC MOUNTING AND ULTRASONIC MOUNTING APPARATUS USING THE SAME

(75) Inventors: Norio Kainuma, Kawasaki (JP); Hidehiko Kira, Kawasaki (JP); Kenji Kobae, Kawasaki (JP); Takayoshi Matsumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 494 days.

(21) Appl. No.: 11/062,789

(22) Filed: Feb. 23, 2005

(65) Prior Publication Data
US 2006/0097028 A1 May 11, 2006

(30) Foreign Application Priority Data
Nov. 9, 2004 (JP) .............................. 2004-325281

(51) Int. Cl.
*B23K 1/06* (2006.01)
*B23K 5/20* (2006.01)
*B23K 37/00* (2006.01)
(52) U.S. Cl. .................. 228/110.1; 228/1.1; 156/73.1

(58) Field of Classification Search ................ 156/73.1; 228/1.1, 110.1
See application file for complete search history.

(56) References Cited

U.S. PATENT DOCUMENTS

| 5,820,011 | A  | * | 10/1998 | Ito et al. ....................... 228/1.1 |
| 2003/0019561 | A1 | * | 1/2003 | Tominaga et al. ........... 156/73.1 |
| 2004/0190733 | A1 | * | 9/2004 | Nayar et al. ................... 381/98 |

FOREIGN PATENT DOCUMENTS

| JP | 2004-047692 | 2/2004 |
| JP | 2004-087539 | 3/2004 |

* cited by examiner

*Primary Examiner*—Jerry Lorengo
*Assistant Examiner*—Nicholas P. D'Aniello
(74) *Attorney, Agent, or Firm*—Arent Fox LLP

(57) ABSTRACT

A method of ultrasonic mounting can increase mounting efficiency by using high-frequency ultrasound and can also mount large semiconductor chips. The method ultrasonically bonds a semiconductor chip 52 to a substrate 50 using an ultrasonic mounting apparatus including a horn 15 that propagates ultrasonic vibration of an ultrasonic vibrator, the horn 15 being made of a ceramic that has a higher vibration propagation speed than metal. The method includes steps of disposing the substrate 50 on a stage 13, disposing the semiconductor chip 52 on the substrate 50, and placing the semiconductor chip 52 in contact with a convex part 15a provided on the horn 15 and applying ultrasonic vibration to bond the semiconductor chip 52 to the substrate 50.

4 Claims, 5 Drawing Sheets

METHOD OF ULTRASONIC MOUNTING AND ULTRASONIC MOUNTING APPARATUS USING THE SAME

BACKGROUND OF THE INVENTION

1. Field of the Invention

The present invention relates to a method of ultrasonic mounting that bonds a semiconductor chip to a substrate and an ultrasonic mounting apparatus using the same.

2. Related Art

When flip-chip bonding and mounting a semiconductor chip on a circuit board, a method is used that places electrode terminals, such as bumps, of the semiconductor chip in contact with electrode terminals, such as pads, of the circuit board and applies ultrasonic vibration to the semiconductor chip to bond the electrode terminals of the semiconductor chip and the circuit board together.

Conventionally, around 50 kHz is used as the frequency of the ultrasound applied to the semiconductor chip.

However, the present inventors have discovered that a large amount of bonding energy is obtained when ultrasound with a high frequency of around 200 kHz is used, which means that the mounting efficiency can be increased.

During ultrasonic mounting, vibration is applied from an ultrasonic vibrator to the semiconductor chip via a horn, and to transmit a large amount of vibration energy, the horn is provided with a convex part of a required width at a position corresponding to the loop (maximum amplitude point) of the vibration caused by the ultrasonic vibration and the semiconductor chip is placed in contact with this convex part to transmit the vibration energy.

When high-frequency ultrasound is used, there is a corresponding reduction in wavelength. Accordingly, the width of the convex part provided corresponding to the maximum amplitude point inevitably becomes narrow, so that there is the new problem that only small semiconductor chips can be mounted.

SUMMARY OF THE INVENTION

The present invention was conceived to solve the problems described above, and it is an object of the present invention to provide a method of ultrasonic mounting and an ultrasonic mounting apparatus using the same that can increase mounting efficiency by using high-frequency ultrasound and can also mount large semiconductor chips.

A method of ultrasonic mounting according to the present invention ultrasonically bonds a semiconductor chip to a substrate using an ultrasonic mounting apparatus in which a horn that propagates ultrasonic vibration of an ultrasonic vibrator is made of a ceramic that has a higher vibration propagation speed than metal, the method including steps of: disposing the substrate on a stage; disposing the semiconductor chip on the substrate; and placing the semiconductor chip in contact with a convex part provided on the horn and applying ultrasonic vibration to bond the semiconductor chip to the substrate.

An ultrasonic mounting apparatus according to the present invention includes a horn for propagating ultrasonic vibration of an ultrasonic vibrator and bonds a semiconductor chip to a substrate by placing the semiconductor chip in contact with a convex part of the horn and applying ultrasound, wherein the horn is formed of a ceramic that has a higher vibration propagation speed than metal.

Stepped parts may be provided in walls of the convex part.

A spacer, which is composed of a material that has a vibration propagation speed of an intermediate magnitude between a vibration propagation speed of the ultrasonic vibrator which is made of metal and a vibration propagation speed of the horn which is made of ceramic, may be interposed at a joint between the ultrasonic vibrator and the horn.

A male screw for joining to the horn may be formed on the ultrasonic vibrator and a coating layer composed of a soft metal material such as copper or solder may be formed on the male screw.

Another method of ultrasonic mounting according to the present invention ultrasonically bonds a semiconductor chip to a substrate using an ultrasonic mounting apparatus including a horn that propagates ultrasonic vibration of an ultrasonic vibrator, two convex parts being formed on the horn corresponding to maximum amplitude points that appear one wavelength apart and vibrate in the same direction due to the ultrasonic vibration, the method including steps of: disposing the substrate on a stage; disposing the semiconductor chip on the substrate; and inserting the semiconductor chip between the two convex parts of the horn and applying ultrasonic vibration from the two convex parts to bond the semiconductor chip to the substrate.

Stepped parts that can be engaged by the edge parts of the semiconductor chip may be formed in walls of the two convex parts that face one another, the semiconductor chip may be inserted between the two convex parts so that the edge parts engage the stepped parts, and ultrasound may be applied while the semiconductor chip is pressed by surfaces of the stepped parts.

The semiconductor chip may be inserted between the two convex parts via an elastic body.

Another method of ultrasonic mounting according to the present invention ultrasonically bonds a semiconductor chip to a substrate using an ultrasonic mounting apparatus including a stage that propagates ultrasonic vibration of an ultrasonic vibrator, two convex parts being formed on the stage corresponding to maximum amplitude points that appear one wavelength apart and vibrate in the same direction due to the ultrasonic vibration, the method comprising steps of: disposing the substrate on the stage so as to be inserted between the two convex parts; disposing the semiconductor chip on the substrate; and applying ultrasonic vibration from the two convex parts to the substrate while the semiconductor chip is pressed by a pressing mechanism to bond the semiconductor chip to the substrate.

Stepped parts that can be engaged by the edge parts of the substrate may be formed in walls of the two convex parts that face one another and the substrate may be inserted between the two convex parts so that the edge parts engage the stepped parts.

Walls of the two convex parts that face one another may be formed as inclined surfaces and the substrate may be disposed between the two convex parts so as to be inserted between the inclined surfaces.

The substrate may be inserted between the two convex parts via an elastic body.

With the method of ultrasonic mounting and ultrasonic mounting apparatus according to the present invention, it is possible to increase mounting efficiency by using high-frequency ultrasound and to mount large semiconductor chips.

DESCRIPTION OF THE PREFERRED EMBODIMENTS

Preferred embodiments of the present invention will now be described in detail with reference to the attached drawings.

Figure 1:
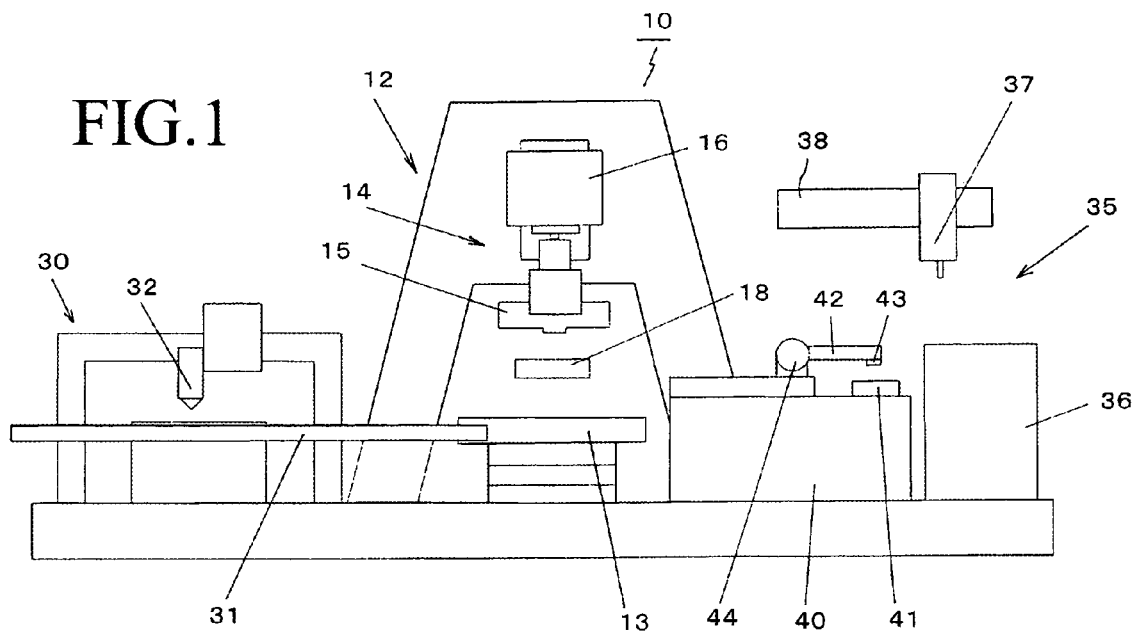
FIG. 1 is a schematic diagram showing the entire construction of a mounting apparatus.

FIG. 1 is a schematic diagram showing one example of the entire construction of a flip-chip mounting apparatus 10.

Reference numeral 12 designates an ultrasonic bonding unit. The ultrasonic bonding unit 12 includes a stage 13 onto which a substrate is conveyed and a bonding tool 14 that is disposed above the stage 13, holds a semiconductor chip on a lower surface thereof, and can move relatively toward and away from the stage 13.

The stage 13 is composed of a well-known XY table and can be moved in a desired direction within a horizontal plane by a driving unit, not shown. The XY table is constructed so as to be capable of being rotated within the horizontal plane about the vertical axis by a rotational driving unit, not shown.

The bonding tool 14 is composed of a well-known ultrasonic bonding device, and includes a horn 15 for ultrasonic bonding and a pressing device 16 that is composed of a cylinder mechanism or the like that moves the horn 15 up and down. A semiconductor chip is held on a lower surface of the horn 15 by suction.

A camera device 18 for position recognition is disposed so as to be capable of insertion between the stage 13 and the bonding tool 14. The camera device 18 detects the positions of a substrate conveyed onto the stage 13 and a semiconductor chip held on the horn 15 of the bonding tool 14, and aligns the substrate and the semiconductor chip by horizontally moving the stage 13 and/or rotating the stage 13 within the horizontal plane.

Figure 2:
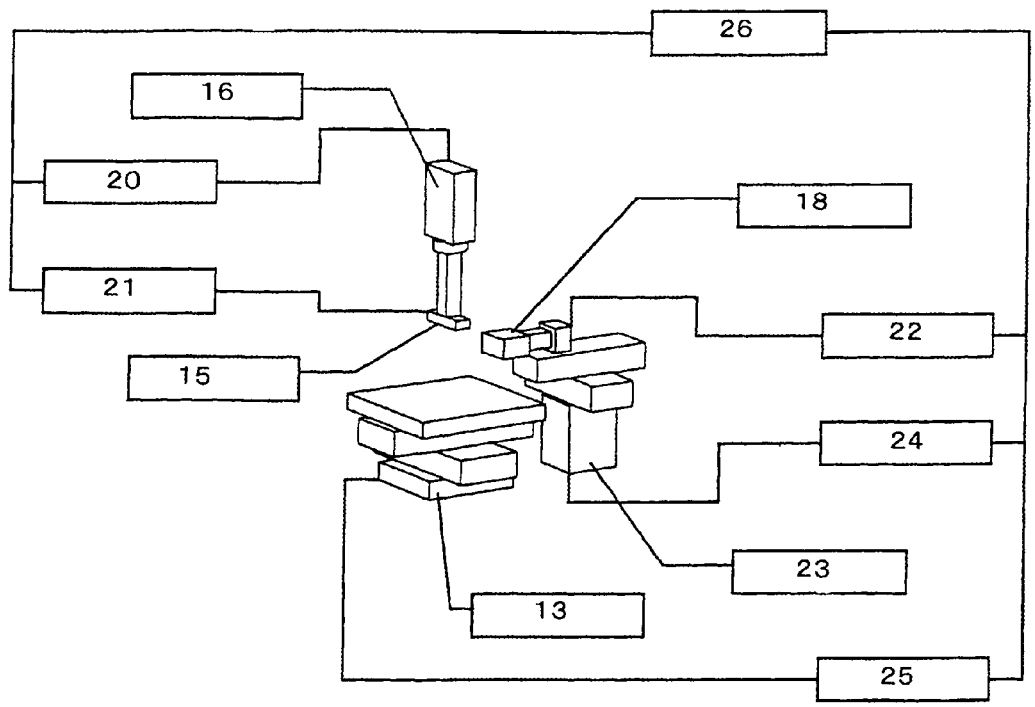
FIG. 2 is a diagram useful in further explaining an ultrasonic bonding unit in the mounting apparatus shown in FIG. 1.

FIG. 2 is a diagram useful in further explaining the ultrasonic bonding unit 12. The ultrasonic bonding unit 12 is a well-known mechanism and therefore will be described in brief.

Reference numeral 20 designates a pressing force control unit that controls the pressing device 16, 21 an ultrasonic vibrator, 22 an image processing unit, 23 a moving device that moves the camera device 18, 24 a movement control unit that controls movement by the moving device 23, 25 an alignment control unit that controls movement and rotation of the stage 13, and 26 a main controller.

By driving the moving device 23 using the movement control unit 24, the camera device 18 is inserted between the substrate that has been conveyed onto the stage 13 and the semiconductor chip that is held on the horn 15 by suction. Image data from the camera device 18 is inputted into the image processing unit 22, positional displacements between the substrate and the semiconductor chip are detected, and the stage 13 is moved and/or rotated by the alignment control unit 25 to correct any positional displacements, thereby aligning the substrate and the semiconductor chip. Next, the camera device 18 is withdrawn. After this, the pressing device 16 is driven by the pressing force control unit 20 to lower the horn 15 and apply a predetermined force to the semiconductor chip held on the lower surface of the horn 15 and ultrasound is applied from the ultrasonic vibrator 21 to the semiconductor chip to bond the semiconductor chip to the substrate. Driving control of the various control units is entirely carried out by a processing program set in the main controller 26.

In FIG. 1, reference numeral 35 designates a conveying unit for semiconductor chips.

A large number of semiconductor chips are stored on a tray (not shown) and are supplied by a chip supplying stage 36. Using a chip handler 38 that includes the suction nozzle 37 that can move up and down and horizontally, the semiconductor chips stored in the tray are held one at a time by suction on the suction nozzle 37 and are conveyed onto a mounting table 41 of a chip inverting stage 40.

The chip inverting stage 40 has a suction arm 42. The suction arm 42 includes a suction nozzle 43 and is provided so as to be capable of being inverted by 180° by an inverting device 44 between a position located above the mounting table 41 and a position on an opposite side. The inverting device 44 is also provided so as to be capable of being moved back and forth by a driving unit, not shown, in a direction that approaches the mounting table 41 and a direction that approaches the horn 15.

The semiconductor chip is conveyed onto the mounting table 41 with a surface on which bumps are formed facing upwards. By holding the semiconductor chip conveyed onto the mounting table 41 by suction on the suction nozzle 43 of the suction arm 42, inverting the suction arm 42, and moving the semiconductor chip towards the horn 15, the semiconductor can be held on the lower surface of the horn 15 by suction. The semiconductor chip therefore becomes held by suction on the horn 15 with the surface on which the bumps are formed facing downwards.

It should be noted that the suction nozzle 43 is provided so as to be capable of being inwardly and outwardly projected (moved) by a mechanism, not shown, in a direction perpendicular to the suction arm 42 so that a semiconductor chip can be smoothly transferred between the mounting table 41 and the horn 15.

The substrate is conveyed onto the stage 13 by a substrate conveyor or the like, not shown.

On the other hand, as described above, a semiconductor chip 52 is conveyed into the ultrasonic bonding unit 12 by the conveying unit 35 for semiconductor chips and is held by suction on the lower surface of the horn 15.

The camera device 18 is inserted between the substrate 50 conveyed onto the stage 13 and the semiconductor chip 52 held on the horn 15 and alignment of the substrate 50 and the semiconductor chip 52 is carried out as described above.

Next, the camera device 18 is withdrawn and the horn 15 on which the semiconductor chip 52 is held by suction is lowered by the pressing device 16 so that the semiconductor chip 52 is pressed onto the substrate 50 with the required pressing force. After this, the ultrasonic vibrator 21 is operated and ultrasound is applied to the semiconductor chip 52 from the horn 15. By doing so, bumps 52a of the semiconductor chip 52 are ultrasonically bonded to pads (not shown) of the substrate 50.

Figure 3:
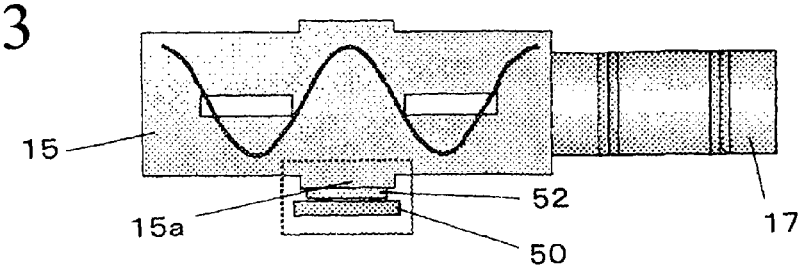
FIG. 3 is a diagram useful in explaining the relationship between a horn and an ultrasonic vibrator.
Figure 4:
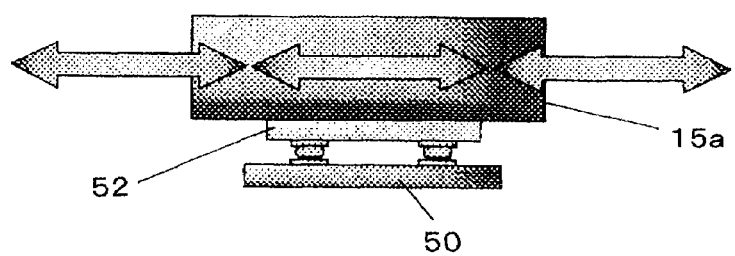
FIG. 4 is an enlarged view of part of FIG. 3.

FIG. 3 shows the relationship between the horn 15, the ultrasonic vibrator 17, the semiconductor chip 52, and the substrate 50 in the flip-chip mounting apparatus 10 described above. FIG. 4 is an enlarged view of part of FIG. 3. Convex parts 15a are formed on an upper surface and a lower surface of the horn 15.

The ultrasonic vibration propagates as compressional waves inside the horn 15. In this case, in principle, loops (maximum amplitude points) occur at both ends of the horn 15 and a plurality of other maximum amplitude points occur in intermediate part of the horn 15. The convex parts 15a are formed with a required width at a position corresponding to such a maximum amplitude point.

Such maximum amplitude points for the ultrasonic vibration naturally occur at intervals of one half of the wavelength.

The positions of the maximum amplitude points of the compressional waves are positions at which the maximum vibration in the horizontal direction can be applied from the horn 15 to the semiconductor chip 52 and are positions where the ultrasonic energy can be transmitted to the greatest possible extent, and by providing the convex parts 15a of the required width at such positions, it is possible to carry out ultrasonic bonding of the semiconductor chip 52 efficiently. The width of the convex parts 15a extends across a maximum amplitude point and corresponds to a range where a substantially uniform amplitude value is obtained.

The ultrasonic vibrator 17 is composed of metal, such as a titanium alloy, in which a piezoelectric element is incorporated.

As in a conventional device, the horn 15 is formed of metal such as titanium alloy.

The speed at which ultrasound propagates within a member is unique to the member, and is determined by the material used.

However, the relationship between the propagation speed C, the frequency f, and the wavelength λ is C=f·λ.

Accordingly, when the frequency is changed from 50 kHz to a high frequency of 200 kHz, the wavelength is quartered. Conventionally, if the horn 15 is formed of a metal such as a titanium alloy, when the frequency is 50 kHz, it is possible to set the width of the convex parts 15a at around 12 mm and bonding can be carried out for semiconductor chips that are around 12 mm in size. However, when the frequency is raised to 200 kHz, the wavelength is quartered so that the width of the convex parts 15a is also reduced to around one quarter, that is, the width can be set at only around 3 to 4 mm, so that large semiconductor chips can no longer be mounted.

However, in the present embodiment, the horn 15 to which the ultrasonic vibration of the ultrasonic vibrator is propagated is formed of a ceramic that has a high vibration propagation speed compared to metal.

The vibration propagation speed (m/sec) of various metals and ceramics are shown below.

| | | |
|---|---|---|
| Iron | 5,950 | |
| A5052 | 6,190 | |
| Titanium Alloy | 6,313 | (Ti-6Al-4V Alloy) |
| Zirconia | 7,036 | |
| Cermet | 9,086 | |
| Aluminum Nitride | 10,198 | |
| Silicon Nitride | 10,764 | |
| Sialon | 11,032 | |
| Alumina | 11,804 | |
| Silicon Carbide | 12,018 | |
| Single Crystal Sapphire | 12,624 | |

For the present invention, the expression "ceramics" includes zirconia and cermet. Aside from these, ceramics such as mullite, titania ceramics, and cordierite are effective.

As described above, when ceramics are used, the vibration propagation speed is around double that of metal, and accordingly even when high frequency ultrasound with a frequency of 200 kHz is used, the width of the convex parts 15a of the horn 15 can be increased to around 8 mm, so that even large semiconductor chips can be mounted.

Figure 5:
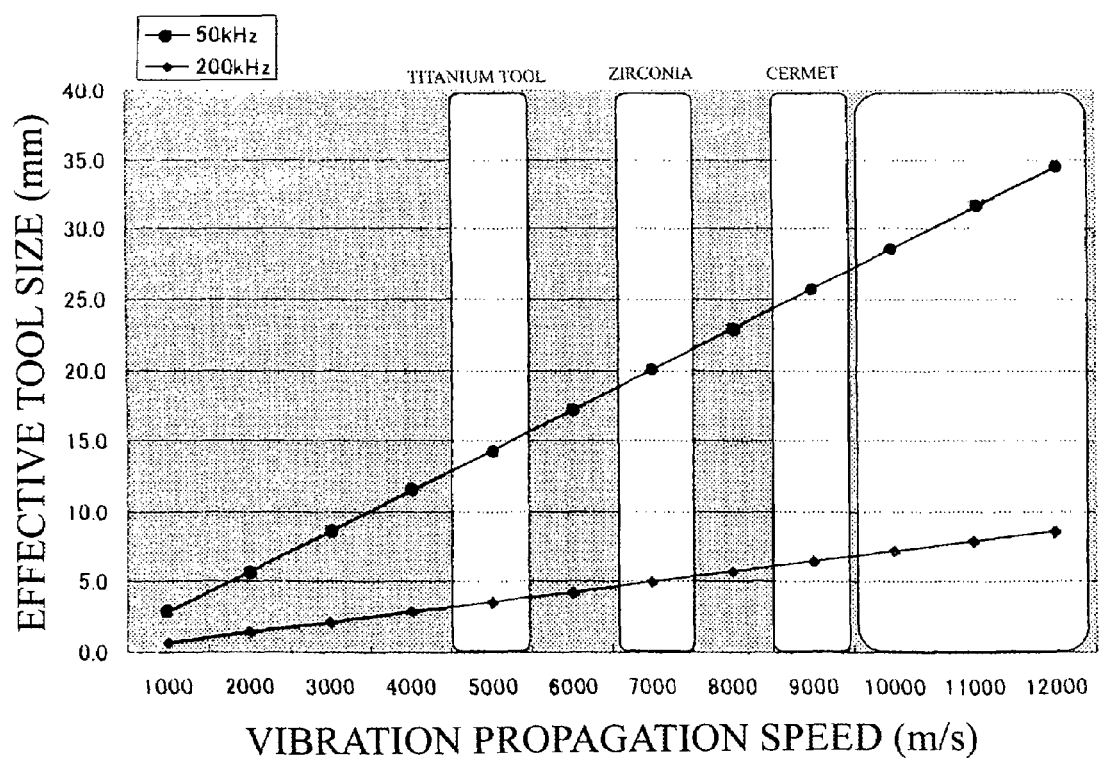
FIG. 5 is a graph showing the relationship between the vibration propagation speed due to the horn material and the effective tool size.

FIG. 5 is a graph showing a model of the relationship between various materials of the horn and the vibration propagation speed and effective tool size (the width of the convex parts). It can therefore be understood that the tool size (the width of the convex parts) can be increased by using ceramics as the material of the horn 15.

Figure 6A:
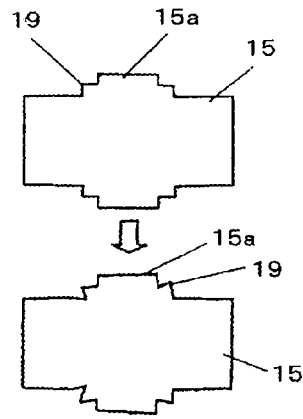
FIGS. 6A and 6B are diagrams useful in explaining a construction where stepped parts are provided in walls of the convex parts of the horn.
Figure 6B:
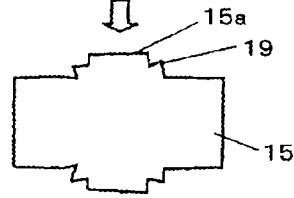

FIGS. 6A and 6B show an embodiment where stepped parts 19 are provided in the walled parts of the convex parts 15a of the horn 15 described above.

Figure 7A:
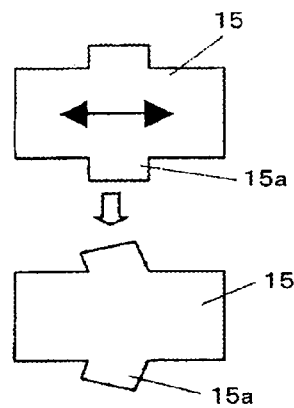
FIGS. 7A and 7B are diagrams useful in explaining warping of the convex parts.
Figure 7B:
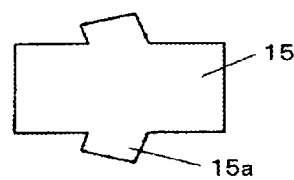

In FIGS. 7A and 7B, the convex parts 15a are simply provided on the horn 15, but due to the provision of the convex parts 15a, an amplitude component is produced in a height direction (Z direction) of the convex parts 15a and the convex parts 15a deform to become warped (see FIG. 7B), so that there is the problem that ultrasonic vibration cannot be transmitted uniformly to the semiconductor chip 52.

As shown in FIG. 6B, by providing stepped parts 19 in the walls of the convex parts 15a, there is the effect that warping is absorbed by the stepped parts 19 and the overall warping of the convex parts 15a is reduced.

Figure 8:
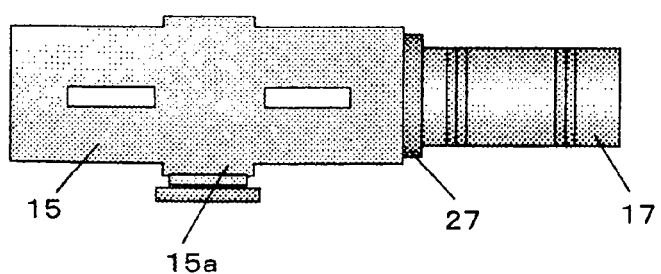
FIG. 8 is a diagram useful in explaining an embodiment where a spacer is interposed between the horn and the ultrasonic vibrator.

FIG. 8 shows an embodiment in which a spacer 27 is interposed at a joint of the horn 15 and the ultrasonic vibrator 17.

A material that has a vibration propagation speed of an intermediate magnitude between the vibration propagation speed of the ultrasonic vibrator 17 that is made of metal and the vibration propagation speed of the horn 15 that is made of ceramic is used for this spacer 27.

As one example, titanium alloy is used as the ultrasonic vibrator 17, cermet is used as the spacer 27, and alumina is used as the horn 15.

When the ultrasonic vibrator 17 is made of metal and the horn 15 is made of ceramic, there is a large difference in vibration propagation speed due to these materials, so that there is the risk of the ultrasonic vibration being reflected at the interface of the ultrasonic vibrator 17 and the horn 15 which reduces the transmissibility of the ultrasound, but this problem can be solved by interposing the spacer 27 that has an intermediate vibration propagation speed relative to the two parts.

Figure 9:
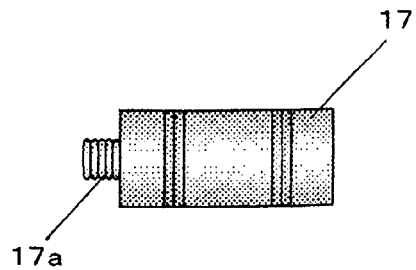
FIG. 9 is a diagram useful in explaining an embodiment where a coating layer is formed on a male screw of the ultrasonic vibrator.

FIG. 9 shows an embodiment in which a coating layer composed of a soft metal material such as copper or solder is formed on a surface of a male screw 17a of the ultrasonic vibrator 17 used for joining the horn 15.

The ultrasonic vibrator 17 is integrated by screwing the male screw 17a into a female screw thread (not shown) of the horn 15, and by providing a coating layer of a soft metal material on the surface of the male screw 17a, gaps between the two parts are filled when the different materials are screwed together and the different materials can be connected so as to fit together well.

Figure 10:
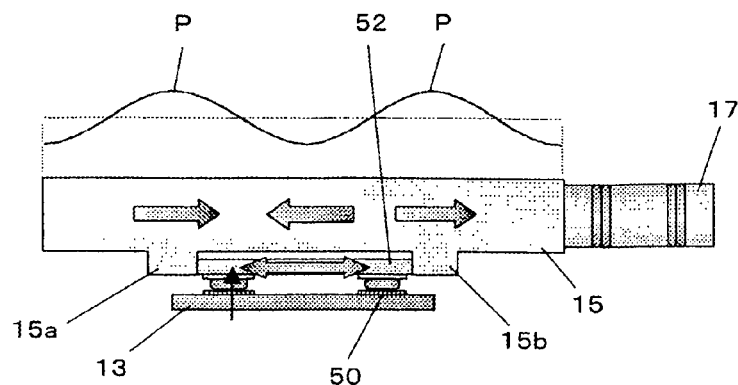
FIG. 10 is a diagram useful in explaining an embodiment where two convex parts are provided on the horn.

FIG. 10 shows yet another embodiment.

In this embodiment, a component with two convex parts 15a, 15b, which correspond to maximum amplitude points P that appear at an interval of one wavelength and vibrate in the same direction due to the ultrasonic vibration, is used as the horn 15.

By disposing the substrate 50 on the stage 13, disposing the semiconductor chip 52 on the substrate 50, inserting the semiconductor chip 52 between the two convex parts 15a, 15b of the horn 15, and applying ultrasonic vibration from the two convex parts 15a, 15b, the semiconductor chip 52 is bonded to the substrate 50.

Here, the rear surface of the semiconductor chip 52 is set so as to not contact the horn 15. Since the compressional waves propagate so that the convex parts 15a, 15b vibrate in synchronization (i.e., with the same phase), there is no risk of the semiconductor chip 52 being destroyed.

Also, since the semiconductor chip 52 is inserted between the two convex parts 15a, 15b that are not half but one wavelength apart, mounting can be carried out for large semiconductor chips. The material of the horn 15 is not limited to ceramics, and a metal horn may be used.

Figure 11:
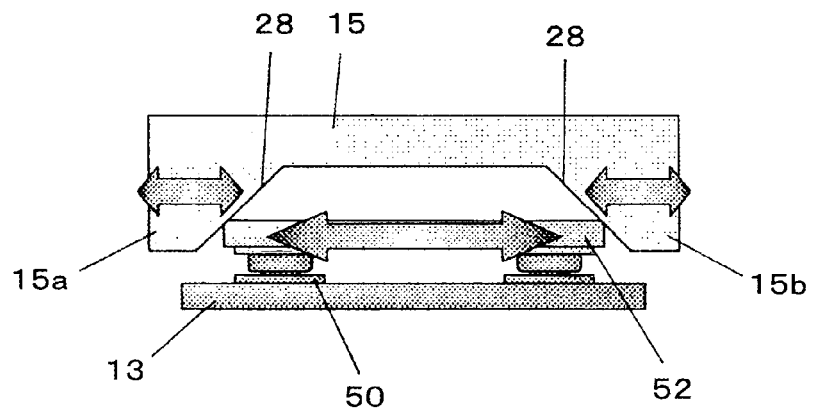
FIG. 11 is a diagram useful in explaining an embodiment where inclined surfaces are provided on the convex parts.

In the embodiment shown in FIG. 11, inclined surfaces 28 are formed at the walls of the convex parts 15a, 15b shown in FIG. 10 that face one another, with the semiconductor chip 52 being disposed in the two convex parts 15a, 15b so as to be inserted between the inclined surfaces 28. By doing so, it is possible to apply ultrasound while pressing the semiconductor chip 52 via the inclined surfaces 28 onto the substrate 50 with a predetermined pressing force. It should be noted that in place of the inclined surfaces 28, stepped parts (not shown) that can engage edge parts of the semiconductor chip 52 can be formed, with the semiconductor chip 52 being inserted between the two convex parts 15a, 15b so that the edge parts engage the stepped parts and with ultrasound being applied while the semiconductor chip 52 is pressed by the stepped surfaces.

Figure 12:
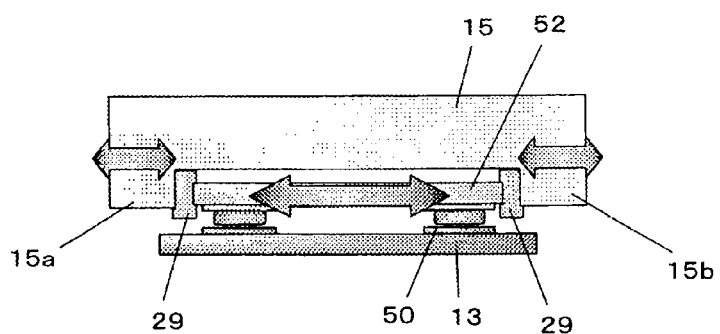
FIG. 12 is a diagram useful in explaining an embodiment where the semiconductor chip is inserted via an elastic body.

In the embodiment shown in FIG. 12, the semiconductor chip 52 is inserted between the convex parts 15a, 15b shown in FIG. 10 via an elastic body 29. Ultrasound can be applied to the semiconductor chip 52 from the convex parts 15a, 15b via the elastic body 29.

Figure 13:
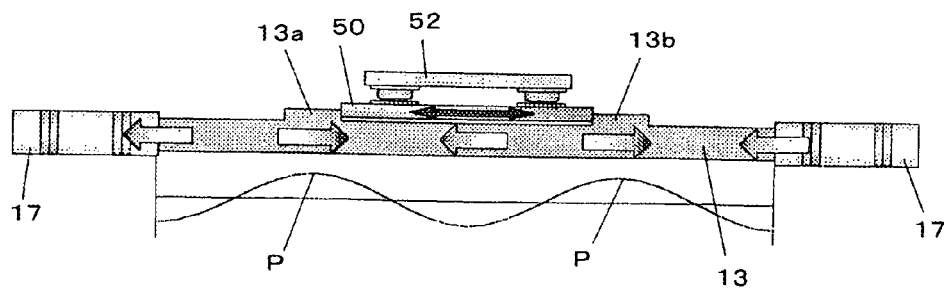
FIG. 13 is a diagram useful in explaining an embodiment where two convex parts are provided on the stage.

FIG. 13 shows a construction where instead of applying ultrasound from a horn, the ultrasonic vibrator 17 is attached to the stage 13 and ultrasonic vibration is applied to the substrate 50 disposed on the stage 13 to bond the semiconductor chip 52.

In this embodiment, two convex parts 13a, 13b corresponding to maximum amplitude points P that appear one wavelength apart and vibrate in the same direction due to the ultrasonic vibration are formed in the stage 13.

The substrate 50 is disposed on the stage 13 so as to be inserted between the two convex parts 13a, 13b, the semiconductor chip 52 is disposed on the substrate 50, and while the semiconductor chip 52 is pressed by an appropriate pressing mechanism (not shown), ultrasonic vibration is applied to the substrate 50 from the two convex parts 13a, 13b so as to bond the semiconductor chip 52 onto the substrate 50.

Figure 14:
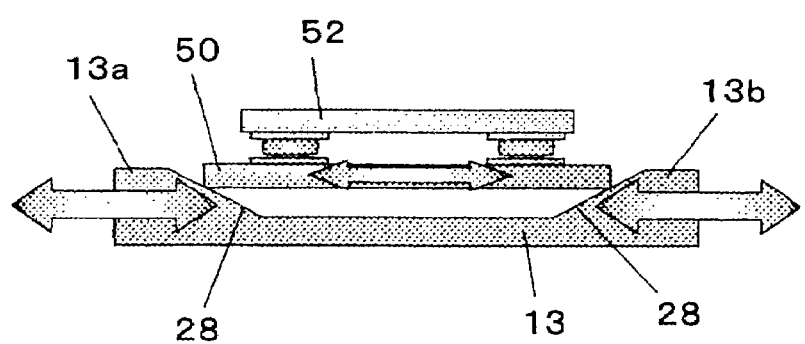
FIG. 14 is a diagram useful in explaining an embodiment where inclined surfaces are provided on the convex parts.

In the embodiment shown in FIG. 14, inclined surfaces 28 are formed at the walls of the convex parts 13a, 13b shown in FIG. 13 that face one another, with the substrate 50 being disposed between the two convex parts 13a, 13b so as to be inserted between the inclined surfaces 28. It is therefore possible to apply ultrasound to the substrate 50 via the inclined surfaces 28. It should be noted that in place of the inclined surfaces 28, stepped parts (not shown) that can be engaged by edge parts of the substrate 50 can be formed, with the substrate 50 being inserted between the two convex parts 13a, 13b so that the edge parts engage the stepped parts.

Figure 15:
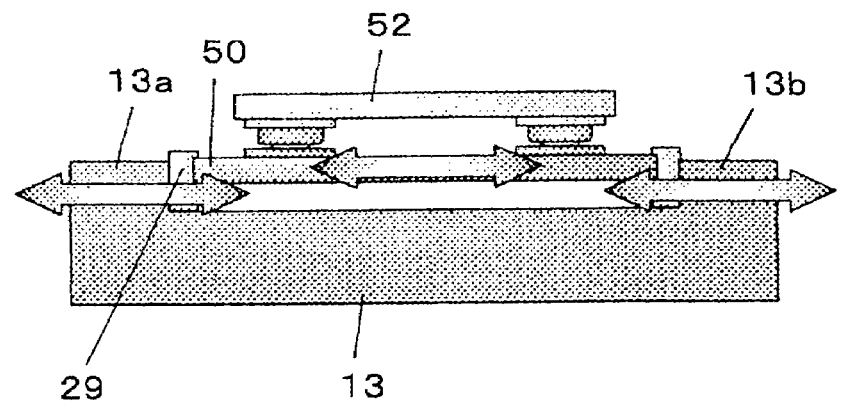
FIG. 15 is a diagram useful in explaining an embodiment where the substrate is inserted via an elastic body.

In the embodiment shown in FIG. 15, the substrate 50 is inserted between the convex parts 13a, 13b shown in FIG. 13 via an elastic body 29. Ultrasound can be applied to the substrate 50 from the convex parts 13a, 13b via this elastic body 29.

What is claimed is:

1. A method of ultrasonic mounting that ultrasonically bonds a semiconductor chip to a substrate using an ultrasonic mounting apparatus in which a horn that propagates ultrasonic vibration of a metallic ultrasonic vibrator is made of a ceramic that has a higher vibration propagation speed than the metal of the ultrasonic vibrator and in which a spacer, which is composed of a material that has a vibration propagation speed of an intermediate magnitude that is between a vibration propagation speed of the metallic ultrasonic vibrator and a vibration propagation speed of the ceramic horn, is interposed at a joint between the ultrasonic vibrator and the horn, the method comprising steps of:
   disposing the substrate on a stage;
   disposing the semiconductor chip on the substrate; and
   placing the semiconductor chip in contact with a convex part provided on the horn and applying ultrasonic vibration from the ultrasonic vibrator to the horn via the spacer so as to bond the semiconductor chip to the substrate.

2. The method according to claim 1, wherein the ultrasonic mounting apparatus in which stepped parts are provided in walls of the convex part is used.

3. The method according to claim 1, wherein a high frequency of 200 KHz is applied from the ultrasonic vibrator to the horn via the spacer.

4. The method according to claim 2, wherein a high frequency of 200 KHz is applied from the ultrasonic vibrator to the horn via the spacer.

* * * * *